United States Patent
Yang

(10) Patent No.: US 6,943,070 B2
(45) Date of Patent: Sep. 13, 2005

(54) COMPLEMENTARY METAL OXIDE SEMICONDUCTOR IMAGE SENSOR AND METHOD OF MANUFACTURING THE SAME

(75) Inventor: Chien-Sheng Yang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 133 days.

(21) Appl. No.: 10/679,333

(22) Filed: Oct. 7, 2003

(65) Prior Publication Data

US 2004/0222417 A1 Nov. 11, 2004

(30) Foreign Application Priority Data

May 9, 2003 (TW) ........................................ 92112761 A

(51) Int. Cl.[7] .......................................... H01L 21/8238
(52) U.S. Cl. ........................... 438/199; 257/72; 257/222
(58) Field of Search .............................. 438/60, 66, 69, 438/199; 257/59, 72, 222

(56) References Cited

U.S. PATENT DOCUMENTS 5,578,184 A * 11/1996 Imataki et al. .............. 205/118
6,548,352 B1 * 4/2003 Rhodes ....................... 438/257
6,797,982 B2 * 9/2004 Okada et al. ................. 257/59

* cited by examiner

Primary Examiner—George Fourson
Assistant Examiner—Fernando L. Toledo
(74) Attorney, Agent, or Firm—Rabin & Berdo, P.C.

(57) ABSTRACT

A complementary metal oxide semiconductor (CMOS) image sensor includes at least a non-single-crystal-silicone-base substrate, an opaque layer, a polysilicon layer, a source, a drain, a gate dielectric layer, a first transparent gate electrode, and a second gate transparent gate electrode. The opaque layer is formed on the non-single-crystal-silicone-base substrate, and the polysilicon layer, formed on the opaque layer, has a charge-generating region. The source and the drain are formed in the polysilicon layer, and a pre-channel region is formed between the source and the drain. The source is located between the pre-channel region and the charge-generating region. The gate dielectric layer is formed on the polysilicon layer, and the first and the second transparent gate electrodes, formed on the gate dielectric layer, are respectively located above the charge-generating region and the pre-channel region.

13 Claims, 5 Drawing Sheets

COMPLEMENTARY METAL OXIDE SEMICONDUCTOR IMAGE SENSOR AND METHOD OF MANUFACTURING THE SAME

This application claims the benefit of Taiwan application Serial No. 92112761, filed May 9, 2003.

BACKGROUND OF THE INVENTION

1. Field of the Invention

The invention relates in general to a complementary metal oxide semiconductor (CMOS) image sensor and method of manufacturing the same, and more particularly to a CMOS image sensor, including a non-single-crystal-silicone-base substrate and transparent gate electrodes, and method of manufacturing the same.

2. Description of the Related Art

In the era of technology with rapid advances, image sensors have been widely applied in the fields of television, toys, security systems, scanners, mobile phones, digital video cameras, digital cameras, and many other portable electronic devices. Currently, there are at least two types of image sensors, which are a charge coupled device and a CMOS image sensor. Owing that CMOS image sensors can be mass-produced in semiconductor manufacturing process, their production costs can be relatively reduced. The features of low cost and low power consumption make CMOS image sensors more and more popular in the market.

FIG. 1 shows a lateral view of a conventional CMOS image sensor. In FIG. 1, the CMOS image sensor 100 includes at least a silicone substrate 102, a source 104, a drain 106, a gate dielectric layer 108, polysilicon gate electrodes 110, and 112, an interlayer dielectric layer 114, a passivation layer 116, and metal electrodes 118, 120, and 122.

The silicone substrate 102 includes a charge-generating region 150 as shown by the dotted line in FIG. 1, and the source 104 and the drain 106 are formed in the silicone substrate 102. A pre-channel region 140 is formed between the source 104 and the drain 106, and the source 104 is located between the charge-generating region 150 and the pre-channel region 140. If the silicone substrate 102 is slightly p-type doped [P−], the source 104 and the drain 106 are heavily n-type doped [N+]. The gate dielectric layer 108, formed on the silicone substrate 102, covers the source 104 and the drain 106.

The polysilicon gate electrodes 110 and 112, formed on the gate dielectric layer 108, are respectively located above the charge-generating region 150 and the pre-channel region 140. The interlayer dielectric layer 114, formed on the gate dielectric layer 108, covers the polysilicon gate electrodes 110, 112, and has an opening 132 between the polysilicon gate electrodes 110 and 112. The metal electrode 118 fills the opening 132 and covers a part of the interlayer dielectric layer 114. The passivation layer 116, formed on the interlayer dielectric layer 114, covers the metal electrode 118. In addition, the passivation 116 has openings 124 and 126, respectively located above the source 104 and the drain 106. The metal electrodes 120 and 122, formed on the passivation layer 116, are respectively deposited in the openings 134 and 136 to be connected with parts of the interlayer dielectric layer 114 at two sides of the polysilicon gate electrode 112.

Moreover, the polysilicon gate electrode 110 and the charge-generating region 150 form a photo detector, and the polysilicon gate electrode 112, the source 114, and the drain 116 form a reset transistor. The metal electrode 120 is an electrode for discharging charges. When light is sensed by the CMOS image sensor 100, a bias is applied on the polysilicon gate electrode 112 so that the reset transistor can equalize the charges in the source 104 and the drain 106. Another bias is, subsequently, applied on the polysilicon gate electrode 110 to make the charge-generating region 150 as a depletion layer. The incident light passes the passivation layer 116, the polysilicon gate electrode 110, the gate dielectric layer 108, and arrives the charge-generating region 150, the depletion layer, to excite charges. The charge-generating region 150 having excited charges, the metal electrode 118, and the source 104 will thus form a charge transfer transistor. A bias is, afterwards, applied on the metal electrode 118 to transfer the charges excited in the charge-generating region 150 to the source 104 and make the charges on the source 104 more than those on the drain 106. A constant bias voltage (VDD) is then applied on the metal electrode 122 to discharge the charges in the source 104 until they are equal to those in the drain 106. Therefore, the intensity of the incident light can be determined by measuring the amount of charges that are discharged from the metal electrode 118. The more intense the incident light is, the more charges are discharged from the metal electrode 118. These discharged charges are accumulated to form a corresponding image.

Since the silicone substrate 102 is very expensive, the production cost will be considerably high. In addition, for a part of the incident light is absorbed by the polysilicon gate electrode 110, it will make an error on the sensing result and the sensing image to be distorted, thereby reducing the image quality.

SUMMARY OF THE INVENTION

It is therefore an object of the invention to provide a CMOS image sensor and method of manufacturing the same. By using a non-single-crystal-silicone-base substrate, the production cost can be reduced. In addition, using transparent gate electrodes instead of the polysilicon ones can solve the issue that a part of the incident light is absorbed by the polysilicon gate electrode in the art. Therefore, errors in the sensing result and the image distortion can be reduced, thereby improving the image quality.

The invention achieves the above-identified objects by providing a CMOS image sensor, including at least a non-single-crystal-silicone-base substrate, an opaque layer, a polysilicon layer, a source, a drain, a gate dielectric layer, a first transparent gate electrode, and a second transparent gate electrode. The opaque layer is formed on the non-single-crystal-silicone-base substrate, and the polysilicon layer, formed on the opaque layer, has a charge-generating region. The source and the drain are formed in the polysilicon layer, and a pre-channel region is formed between the source and the drain. The source is located between the pre-channel region and the charge-generating region. The gate dielectric layer is formed on the polysilicon layer, and the first and the second transparent gate electrodes, formed on the gate dielectric layer, are respectively located above the charge-generating region and the pre-channel region.

The invention achieves the above-identified objects by providing a method of manufacturing a CMOS image sensor. A non-single-crystal-silicone-base substrate is formed first. Subsequently, an opaque layer is formed on the non-single-crystal-silicone-base substrate. A polysilicon layer, having a charge-generating region, is then formed on the opaque layer. Afterwards, a source and a drain are formed in the polysilicon layer. A pre-channel region is formed between the source and the drain, and the source is located between the charge-generating region and the pre-channel region. A gate dielectric layer is, subsequently, formed on the polysilicon layer. A first transparent gate electrode and a second transparent gate electrode are then formed on the gate dielectric layer, which are respectively located above the charge-generating region and the pre-channel region.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a CMOS image sensor and method of manufacturing the same. By using a non-single-crystal-silicone-base substrate, the cost of fabricating can be reduced. In addition, forming transparent gate electrodes instead of the polysilicon ones in the image sensor can solve the issue that a part of the incident light will be absorbed by the polysilicon gate electrode in the art. Therefore, errors in the sensing result and the image distortion can be reduced, thereby the image quality is improved.

Figure 1:
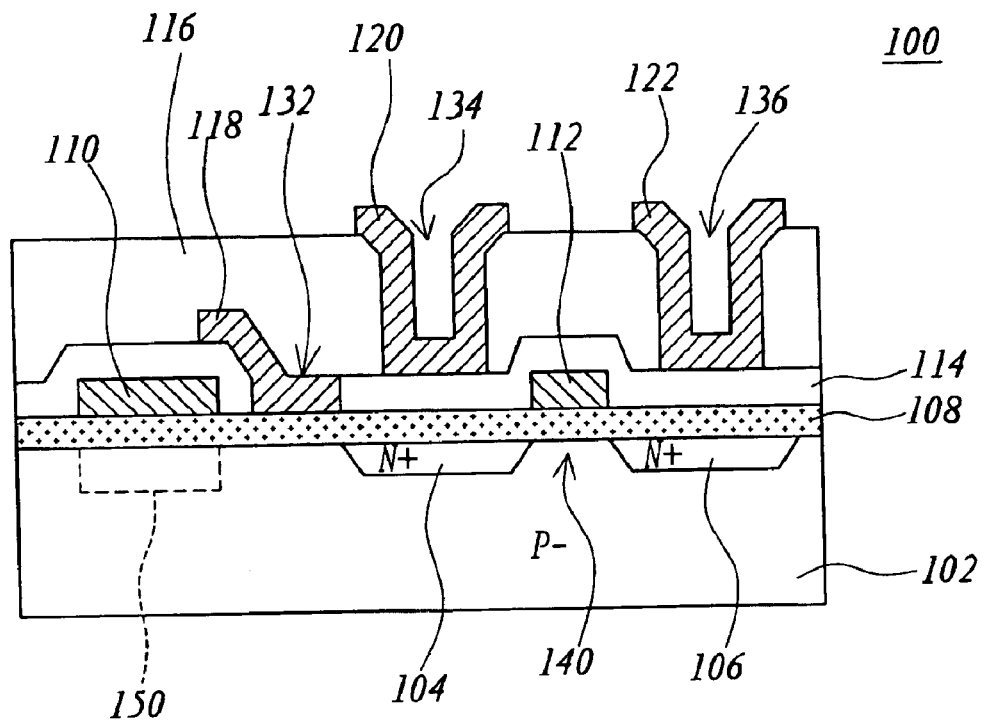
FIG. 1 (Prior Art) is a lateral view of a conventional CMOS image sensor.
Figure 2:
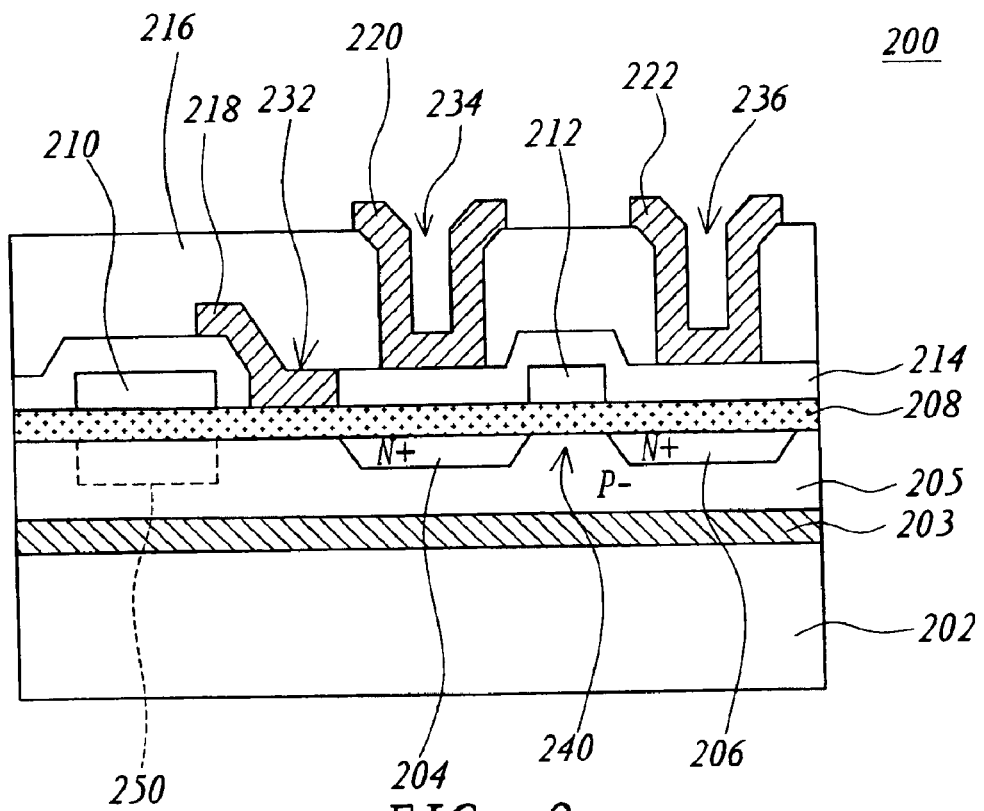
FIG. 2 is a lateral view of a CMOS image sensor according to a preferred embodiment of the invention.

Referring to FIG. 2, a lateral view of a CMOS image sensor according to a preferred embodiment of the invention is shown. The CMOS image sensor 200 includes at least a non-single-crystal-silicone-base substrate 202, an opaque layer 203, a polysilicon layer 205, a source 204, a drain 206, a gate dielectric layer 208, transparent gate electrodes 210 and 212, an interlayer dielectric layer 214, a passivation layer 216, and metal electrodes 218, 220, and 222.

The opaque layer 203 is formed on the non-single-crystal-silicone-base substrate 202, while the polysilicon layer 205 formed on the opaque layer 203. The polysilicon layer has a charge-generating region 250 (as shown by the dotted line in FIG. 2). The source 204 and the drain 206 are formed in the polysilicon layer 205. The top surfaces of the source 204, the drain 206, and the polysilicon layer are at the same level, and the thickness of the source and the drain 204 and 206 is smaller than that of the polysilicon layer 205. A pre-channel region 240 is formed between the source 204 and the drain 206. Moreover, the source 204 is located between the charge-generating region 250 and the pre-channel region 240. If the polysilicon layer is slightly p-type doped [P-], the source and the drain 204 and 206 are heavily N-type doped [N+]. The gate dielectric layer 208, formed on the polysilicon layer 205, covers the source and the drain 204 and 206.

The transparent gate electrodes 210 and 212, formed on the gate dielectric layer 208, are respectively located above the charge-generating region 250 and the pre-channel region 240. The interlayer dielectric layer 214, formed on the gate dielectric layer 208, covers the transparent gate electrodes 210 and 212. The interlayer dielectric layer 214 has an opening 232 located between the transparent gate electrodes 210 and 212. The metal electrode 218, connected with a part of the gate dielectric layer 208, fills the opening 232 and covers a part of the interlayer dielectric layer 214. The passivation layer 216, formed on the interlayer dielectric layer 214, covers the metal electrode 218. The passivation layer 216 has openings 234 and 236 respectively located above the source 204 and the drain 206. The metal electrodes 234 and 236, covering a part of the passivation layer 216, are respectively formed in the openings 234 and 236 to be connected with the parts of the interlayer dielectric layer 214 at two sides of the transparent gate electrode 212.

Moreover, the transparent gate electrode 210 and the charge-generating region 250 form a photo sensor, while the transparent gate electrode 212, the source 204, and the drain 206 form a reset transistor. The metal electrode 220 is an electrode for discharging charges.

The price of the non-single-crystal-silicone-base substrate 202 is lower than that of the typical silicone substrate 102, so the production cost of the invention can be relatively lowered. Furthermore, light passing the transparent gate electrodes 210 will not be absorbed, which reduces the error of the sensing result and the image distortion, thereby improving the image quality. The opaque layer 203, formed on the non-single-crystal-silicone-base substrate 202, can prevent light from going from the bottom of the non-single-crystal-silicone-base substrate 202 to enter the charge-generating region 250, thereby making an error on the sensing result.

Figure 3A:
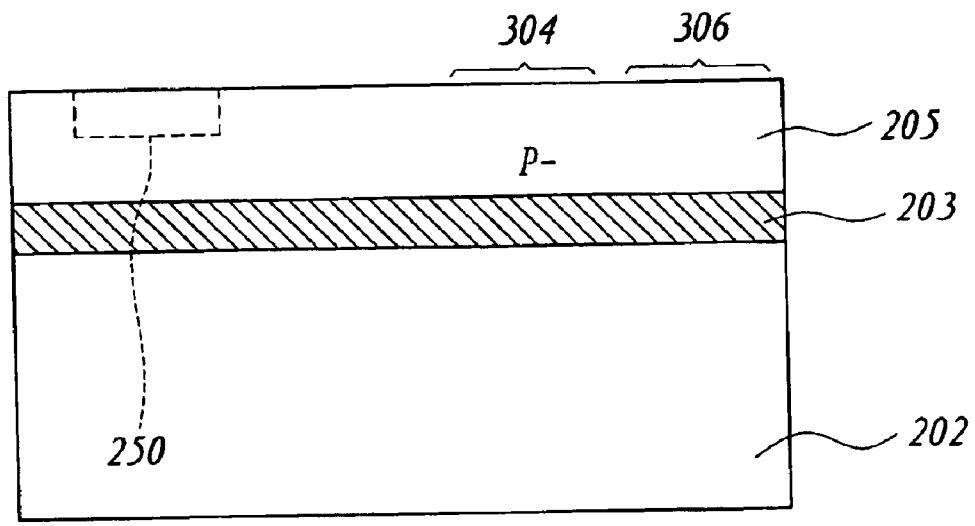
FIGS. 3A to 3E illustrate the steps in the method of manufacturing the CMOS image sensor according to the preferred embodiment of the invention.
Figure 3B:
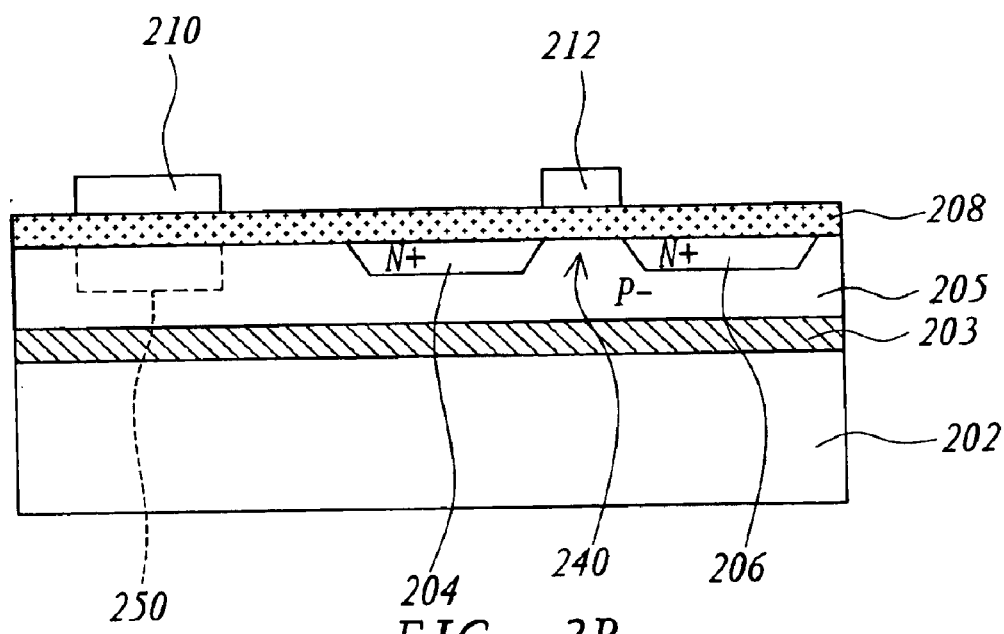

Referring to FIGS. 3A to 3E, steps in the method of manufacturing the CMOS image sensor according to the preferred embodiment of the invention are illustrated. In FIG. 3A, a non-single-crystal-silicone-base substrate 202 is provided first. Subsequently, the opaque layer 203 is formed on the non-single-crystal-silicone-base substrate 202. A polysilicon layer 205, having a charge-generating region 250, is then formed on the opaque layer 203. Pre-doping regions 304 and 306, defined on the polysilcone layer 205, are afterwards doped to respectively form the source 204 and the drain 206 as shown in FIG. 3B. For example, if the polysilicon layer 205 is slightly p-type doped [P-], the source and the drain 204 and 206 are heavily n-type doped [N+]. The pre-channel region 204 is formed between the source and the drain 204 and 206, and the source 204 is located between the charge-generating region 250 and the pre-channel region 240. In FIG. 3B, a gate dielectric layer 208, formed on the polysilicon layer 205, covers the source and the drain 204 and 206. Subsequently, the transparent electrodes 210 and 212 are formed on the gate dielectric electrode 208, which are respectively located above the charge-generating region 250 and the pre-channel region 240.

Figure 3C:
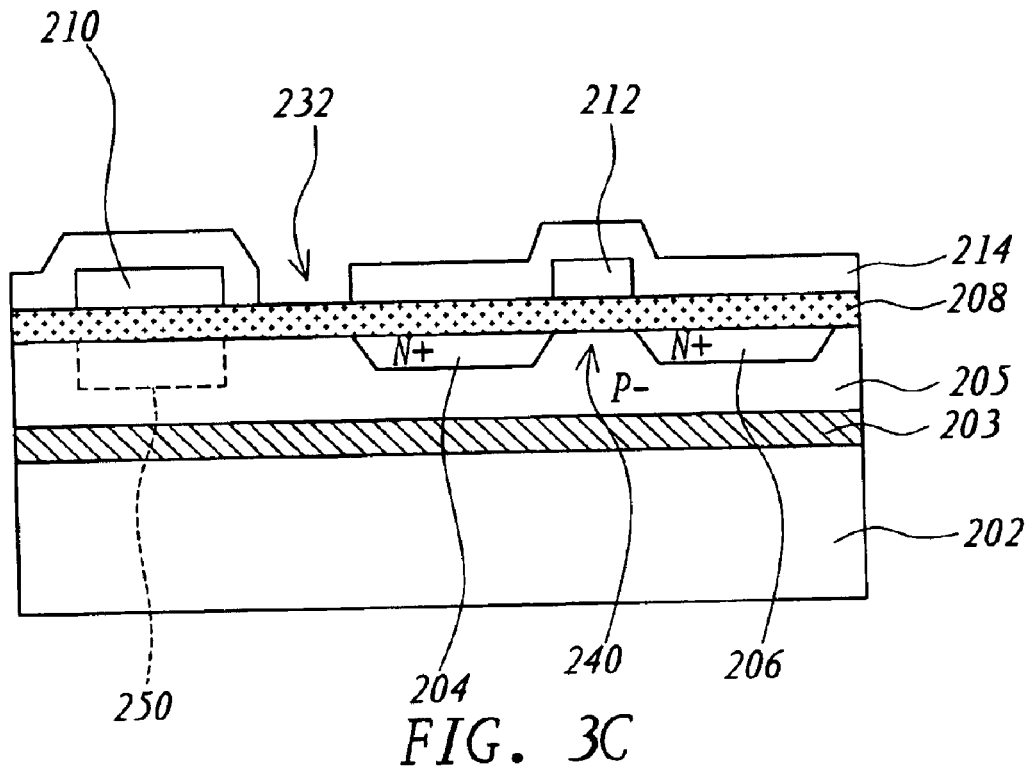

Afterwards, the interlayer dielectric layer 214 having an opening 232 is formed on the gate dielectric layer 208 to cover the transparent gate electrodes 210 and 212 as shown in FIG. 3C. The opening 232, located between the transparent gate electrodes 210 and 212, covers the part of the gate dielectric layer 208 between the source 204 and the charge-generating region 250.

Figure 3D:
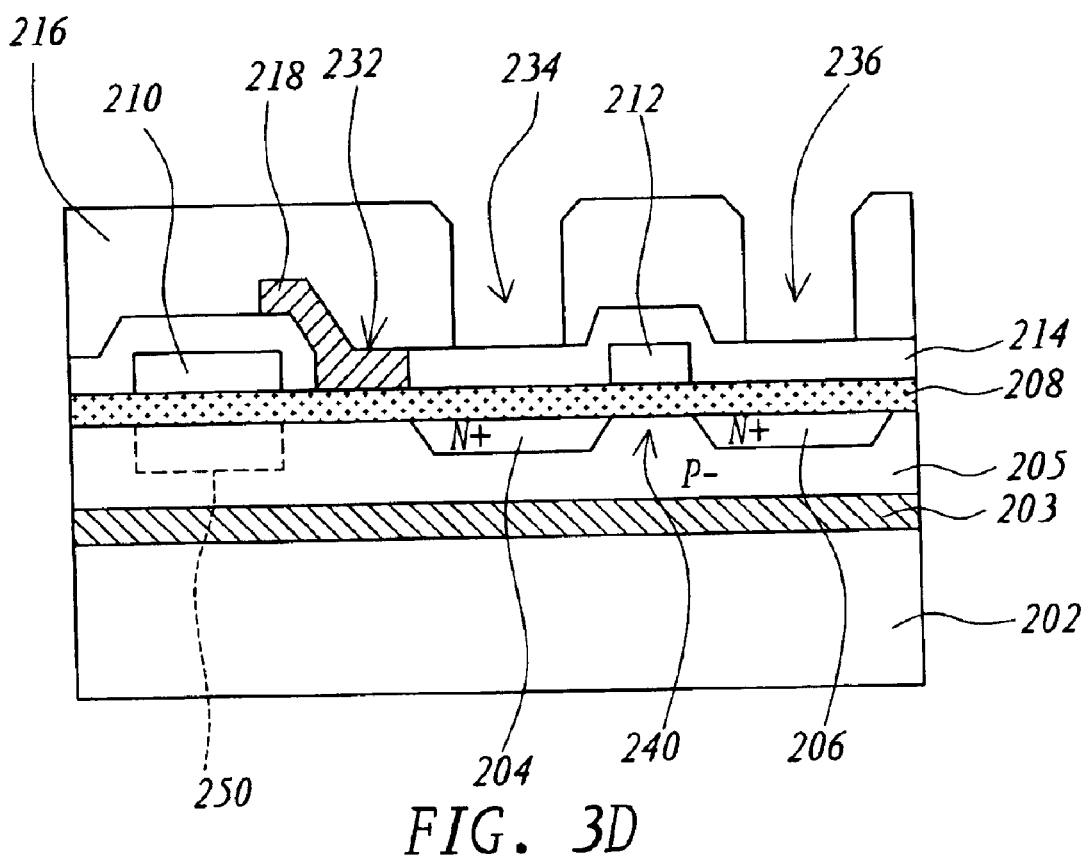
Figure 3E:
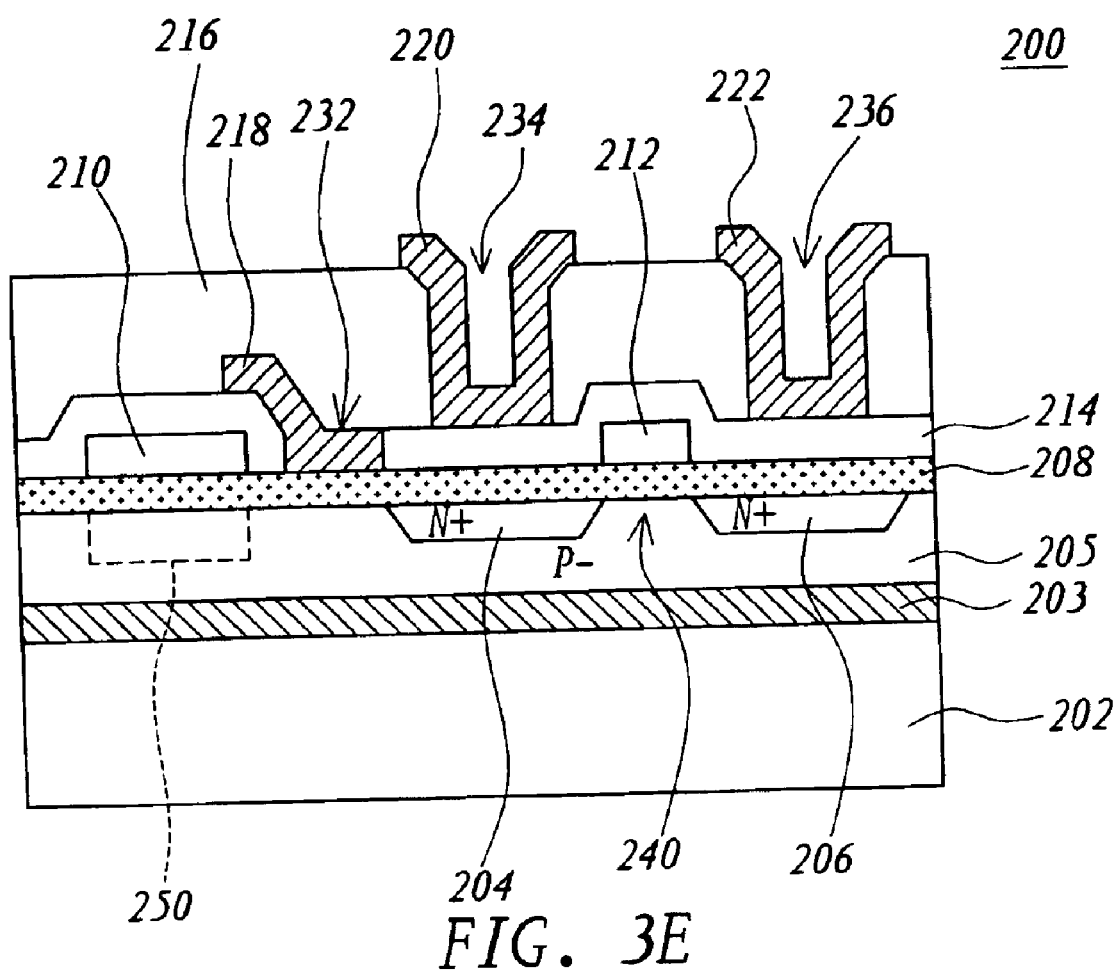

The metal electrode 218 is, subsequently, formed to fill the opening 232, be connected with a part of the gate dielectric layer 208, and cover a part of the interlayer dielectric layer 214 as shown in FIG. 3D. The passivation layer 216 having the openings 234 and 236, is then formed on the interlayer dielectric layer 214 to cover the metal electrode 218. The openings 234 and 236 are respectively located above the sources 204 and 206 to expose parts of the interlayer dielectric layer 214 at two sides of the transparent gate electrode 212. Afterwards, the metal electrodes 220 and 222 are respectively formed in the openings 234 and 236 to cover the exposed parts of the interlayer dielectric layer 214 as shown in FIG. 3E.

Figure 4:
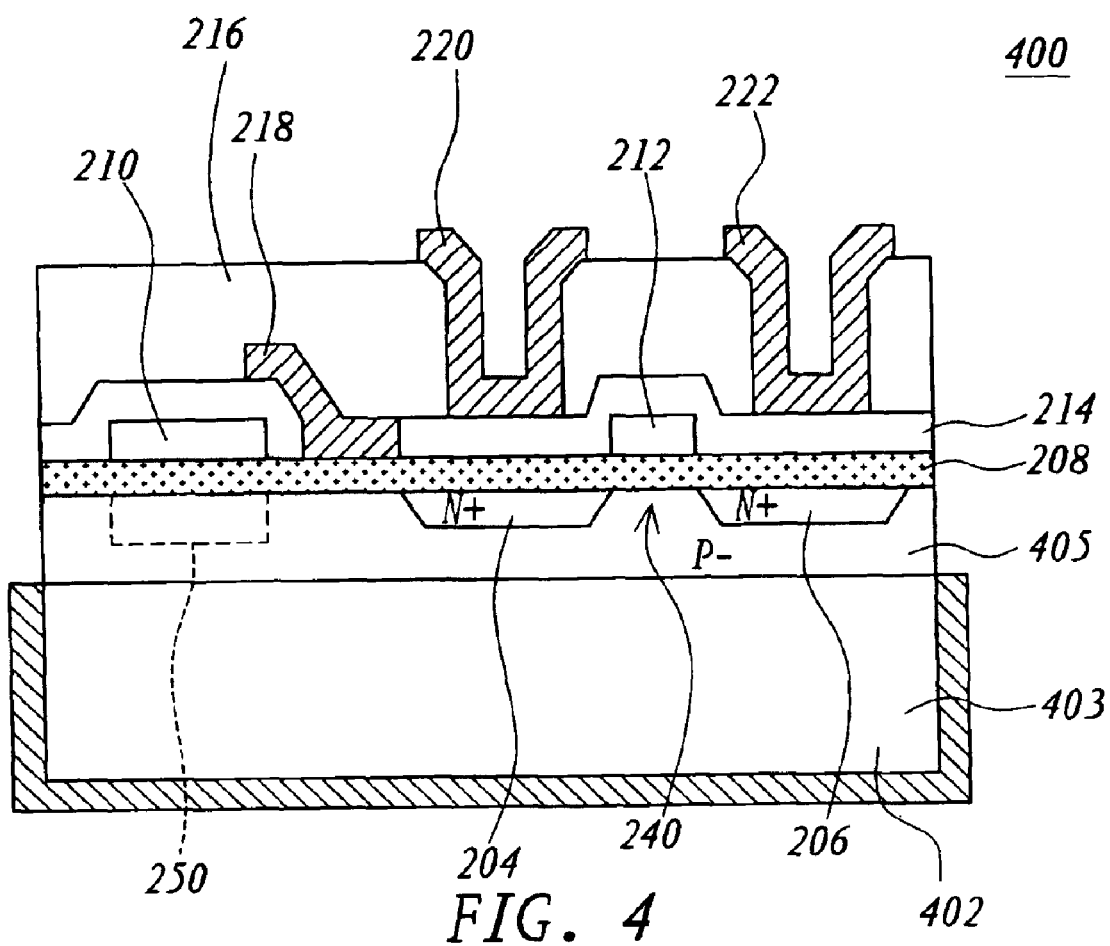
FIG. 4 is a lateral view of a CMOS image sensor according to another preferred embodiment of the invention.

In addition, the polysilicon layer 205 can also be directly formed on the non-single-crystal-silicone-base substrate 202 with an opaque layer 403 formed on the sides and the bottom of the non-single-crystal-silicone-base substrate 202 to prevent light entering the image sensor 400 from the bottom of the substrate 202 as shown in FIG. 4. The CMOS image sensor 400 in FIG. 4 has approximately the same structure with the CMOS image sensor 200 shown in FIG. 2, and the steps of manufacturing the CMOS image sensor 400 are almost the same as those shown in FIGS. 3A to 3E.

However, any one who is skilled in the art realizes that skills of the invention are not limited to all those mentioned above. For example, the transparent gate electrodes 210 and 212 can be made of indium tin oxide (ITO), and the non-single-crystal-silicone-base substrates 202 and 402 can be made of glass, plastics, or insulated materials.

The CMOS image sensor according to the preferred embodiment of the invention has the following advantages:

1. Using the non-single-crystal-silicone-base substrate can reduce the production cost.

2. Forming transparent gate electrodes instead of the typical polysilicon ones in the image sensor can solve the issues that a part of the incident light is absorbed as passing the polysilicon gate electrodes, thus errors on sensing results and distortion of the images are reduced and the image quality is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A complementary metal oxide semiconductor (CMOS) image sensor comprising at least:
    a non-single-crystal-silicon-base substrate;
    an opaque layer, formed on the non-single-crystal-silicon-base substrate;
    a polysilicon layer, formed on the opaque layer, the polysilicon layer comprising a charge-generating region;
    a source and a drain, formed in the polysilicon layer, wherein a pre-channel region is formed in the polysilicon layer between the source and the drain, and the source is located between the charge-generating region and the pre-channel region;
    a gate dielectric layer, formed on the polysilicon layer; and
    a first transparent gate electrode and a second transparent gate electrode, formed on the gate dielectric layer and respectively located above the charge-generating region and the pre-channel region.

2. The image sensor according to claim 1 further comprising:
    an interlayer dielectric layer, formed on the gate dielectric layer and covering the first and the second transparent electrodes, the interlayer dielectric layer comprising a first opening;
    a first metal electrode, which fills the first opening and is coupled to the gate dielectric layer;
    a passivation layer, formed on the interlayer dielectric layer and covering the first metal electrode, the passivation layer comprising a second opening and a third opening, respectively located above the source and the drain; and
    a second metal electrode and a third metal electrode, formed on a part of the passivation layer, and respectively formed in the second opening and the third opening to be connected with a part of the interlayer dielectric layer at two sides of the second transparent gate electrode.

3. The image sensor according to claim 1, wherein the first transparent gate electrode is made of indium tin oxide (ITO).

4. The image sensor according to claim 1, wherein the second transparent gate electrode is made of ITO.

5. A complementary metal oxide semiconductor (CMOS) image sensor comprising at least:
    a non-single-crystal-silicon-base substrate;
    an opaque layer, formed on the sides and the bottom of the non-single-crystal-silicon-base substrate;
    a polysilicon layer, formed on the non-single-crystal-silicon-base substrate;
    a source and a drain, formed in the polysilicon layer, wherein a pre-channel region is formed in the polysilicon layer between the source and the drain;
    a charge-generating region, formed in the polysilicon layer, wherein the source is located between the charge-generating region and the pre-channel region;
    a gate dielectric layer, formed on the polysilicon layer; and
    a first transparent gate electrode and a second transparent gate electrode, formed on the gate dielectric layer and respectively located above the charge-generating region and the pre-channel region.

6. The image sensor according to claim 5 further comprising:
    an interlayer dielectric layer, formed on the gate dielectric layer and covering the first and the second transparent electrodes, the interlayer dielectric layer comprising a first opening;
    a first metal electrode, which fills the first opening and is connected with the gate dielectric layer;
    a passivation layer, formed on the interlayer dielectric layer and covering the first metal electrode, the passivation layer comprising a second opening and a third opening, respectively located above the source and the drain; and
    a second metal electrode and a third metal electrode, formed on a part of the passivation layer, and respectively formed in the second opening and the third opening to be connected with a part of the interlayer dielectric layer at two sides of the second transparent gate electrode.

7. The image sensor according to claim 5, wherein the first transparent gate electrode is made of ITO.

8. The image sensor according to claim 5, wherein the second transparent gate electrode is made of ITO.

9. A method of manufacturing a complementary metal oxide semiconductor (CMOS) image sensor, comprising the steps of:
    providing a non-single-crystal-silicon-base substrate;
    forming an opaque layer on the non-single-crystal-silicon-base substrate;

forming a polysilicon layer on the opaque layer, wherein the polysilicon comprises a charge-generating region;

forming a source and a drain in the polysilicon layer, wherein a pre-channel region is formed in the polysilicon layer between the source and the drain, and the source is located between the pre-channel region and the charge-generating region;

forming a gate dielectric layer on the polysilicon layer; and forming a first transparent gate electrode and a second transparent gate electrode on the gate dielectric layer, wherein the first and the second transparent gate electrodes are respectively located above the charge-generating region and the pre-channel region.

10. The method according to claim 9, wherein the step of forming a source and a drain in the polysilicon layer further comprises the steps of:

defining the top surface of the polysilione layer to form two pre-doping regions; and doping the two pre-doping regions to form the source and the drain in the polysilicon layer.

11. The method according to claim 9, wherein after the step of forming a first transparent gate electrode and a second transparent gate electrode on the gate dielectric layer, the method further comprising the steps of:

forming an interlayer dielectric layer, having a first opening, on the gate dielectric layer, wherein the interlayer dielectric layer covers the first transparent gate electrode and the second transparent gate electrode, and the first opening, located between the first transparent gate electrode and the second transparent gate electrode, exposes a part of the gate dielectric layer;

forming a first metal electrode to fill the first opening and be connected with the gate dielectric layer;

forming a passivation layer, having a second opening and a third opening, on the interlayer dielectric layer, wherein the passivation layer covers the first metal electrode, and the second opening and the third opening are respectively located above the source and the drain, and expose a part of the interlayer dielectric layer; and forming a second metal electrode and a third metal electrode on the passivation layer, wherein the second metal electrode and the third metal electrode are respectively formed in the second opening and the third opening to be connected with parts of the interlayer dielectric layer at two sides of the second transparent gate electrode.

12. The method according to claim 9, wherein the first transparent gate electrode is made of indium tin oxide (ITO).

13. The method according to claim 9, wherein the second transparent gate electrode is made of ITO.

* * * * *